(12) United States Patent
Chen

(10) Patent No.: US 6,627,813 B2
(45) Date of Patent: Sep. 30, 2003

(54) BENT METAL PLATE FOR USE IN AN ELECTRONIC DEVICE

(75) Inventor: Wei-Chen Chen, Hsin-Tien (TW)

(73) Assignee: EMI Stop Corp., Taipei Hsien (TW)

( * ) Notice: Subject to any disclaimer, the term of this patent is extended or adjusted under 35 U.S.C. 154(b) by 0 days.

(21) Appl. No.: 10/308,275

(22) Filed: Dec. 3, 2002

(65) Prior Publication Data

US 2003/0121687 A1 Jul. 3, 2003

(30) Foreign Application Priority Data

Dec. 28, 2001 (TW) .................................. 90223534 U
Aug. 14, 2002 (TW) .................................. 91212617 U

(51) Int. Cl.$^7$ ............................................... H05K 9/00
(52) U.S. Cl. ................................. 174/35 GC; 174/35 R
(58) Field of Search ........................ 174/35 R, 35 GC; 361/800, 816, 818, 753; 277/920

(56) References Cited

U.S. PATENT DOCUMENTS 6,219,239 B1 * 4/2001 Mellberg et al. ............ 361/704
6,346,672 B1 * 2/2002 Horng ........................ 174/35 R
6,359,215 B1 * 3/2002 Horng ....................... 174/35 GC
6,489,555 B1 * 12/2002 Horng ....................... 174/35 GC
6,534,706 B1 * 3/2003 Rapp et al. ................ 174/35 GC
6,538,197 B1 * 3/2003 Kawai ....................... 174/35 GC

* cited by examiner

Primary Examiner—Hung V. Ngo
(74) Attorney, Agent, or Firm—Darby & Darby

(57) ABSTRACT

A bent metal plate for an electronic device includes a spring arm segment bent from one end of a mounting segment, and an abutting segment bent from the spring arm segment, and cooperating with the mounting segment and the spring arm segment to define a buffer space with an opening. A first shielding segment is bent from the abutting segment to block an upper portion of the opening. A second shielding segment is bent from the other end of the mounting segment to block a lower portion of the opening, cooperates with the first shielding segment to define a gap therebetween, and has a blocking portion extending through the gap and into the buffer space to deny access to the buffer space through the gap.

6 Claims, 7 Drawing Sheets

BENT METAL PLATE FOR USE IN AN ELECTRONIC DEVICE

CROSS REFERENCE TO RELATED APPLICATION

This application claims priority of Taiwan Application Nos. 90223534, 91212617, filed on Dec. 28, 2001 and Aug. 14, 2002, respectively.

BACKGROUND OF THE INVENTION

1. Field of the Invention

The present invention relates to a bent metal plate, more particularly to a bent metal plate for use in an electronic device.

2. Description of the Related Art

Referring to FIGS. 1 and 2, a conventional bent metal plate 3 is used in an electronic device that includes a printed circuit board 20 and a conductive element 22, such as a heat sink. As illustrated, the conventional bent metal plate 3 includes a mounting segment 31 secured on the printed circuit board 20 by means of surface mount technique, a spring arm segment 32 bent from one end of the mounting segment 31, and an abutting segment 33 that extends from a distal end of the spring arm segment 31, that is adapted to abut against the conductive element 22 so as to prevent electromagnetic interference to an electronic component disposed between the printed circuit board 20 and the conductive element 22, and that cooperates with the mounting segment 31 and the spring arm segment 32 to define a buffer space thereamong with an opening 30 defined by a distal end of the abutting segment 33 and the other end of the mounting segment 31.

Disadvantages resulting from the use of the aforesaid conventional bent metal plate 3 are as follows:

(1) Due to the presence of the opening 30, the conventional bent metal plate 3 tends to become entangled with an adjacent bent metal plates during storage. Disentanglement of the bent metal plates is inconvenient and troublesome.

(2) During assembly of electronic components on a printed circuit board, a check list card is generally hung from a corner of the printed circuit board by means of a string for checking the progress of the assembly. Since the assemblers are seated at two opposite sides of the assembly line, when the check list card is passed between the assemblers, the string tends to be caught in the buffer space through the opening 30 in the conventional bent metal plate 3. Releasing of the string from the buffer space is time-consuming and consequently prolongs the assembly time. Moreover, the spring arm segment 32 tends to be permanently deformed due to pulling of the string from one side to the opposite side of the assembly line.

(3) The conventional bent metal plates 3 may collide against one another during transport, and thus lead to undesired deformation of the spring arm segments 32.

(4) The abutting segment 33 and the spring arm segment 32 may be permanently deformed in case a relatively high stress is applied to the abutting segment 33 of the conventional bent metal plate 3.

SUMMARY OF THE INVENTION

The object of the present invention is to provide a bent metal plate for use in an electronic device which has a particular construction so as to avoid the aforesaid disadvantages resulting from the use of the conventional bent metal plate.

Accordingly, a bent metal plate of the present invention is adapted to be mounted on a printed circuit board, and includes: a mounting segment adapted to abut against the printed circuit board, extending in a longitudinal direction, and having opposite first and second ends; a spring arm segment bent from the first end of the mounting segment, and having a distal end disposed above the mounting segment; and an abutting segment bent from the distal end of the spring arm segment, vertically spaced apart from the mounting segment, having a distal end generally aligned with the second end of the mounting segment, and cooperating with the mounting segment and the spring arm segment to define a buffer space thereamong with an opening defined by the distal end of the abutting segment and the second end of the mounting segment. The abutting segment is springily depressible together with the spring arm segment toward the mounting segment. The bent metal plate further includes: a first shielding segment bent from the distal end of the abutting segment toward the second end of the mounting segment to block an upper portion of the opening, and formed with at least one retaining channel; and a second shielding segment including at least one shielding piece that is bent from the second end of the mounting segment toward the distal end of the abutting segment to block a lower portion t of the opening, that cooperates with the first shielding segment to define a gap therebetween, and that has a blocking portion extending through the gap and the retaining channel and into the buffer space so as to deny access to the buffer space through the gap.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENTS

Figure 1:
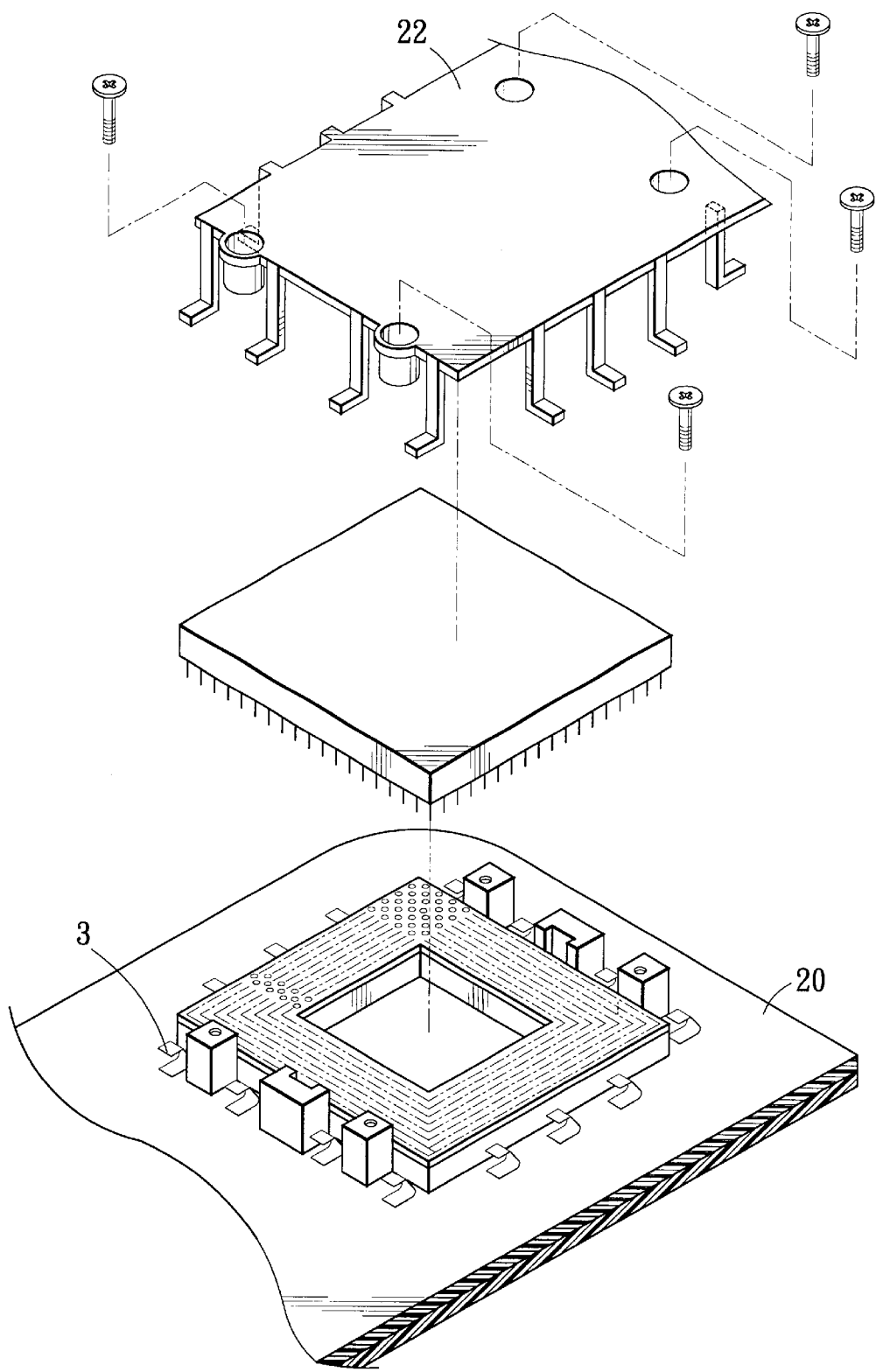
FIG. 1 is a partly exploded view of an electronic device, illustrating how a conventional bent metal plate is used therein.
Figure 2:
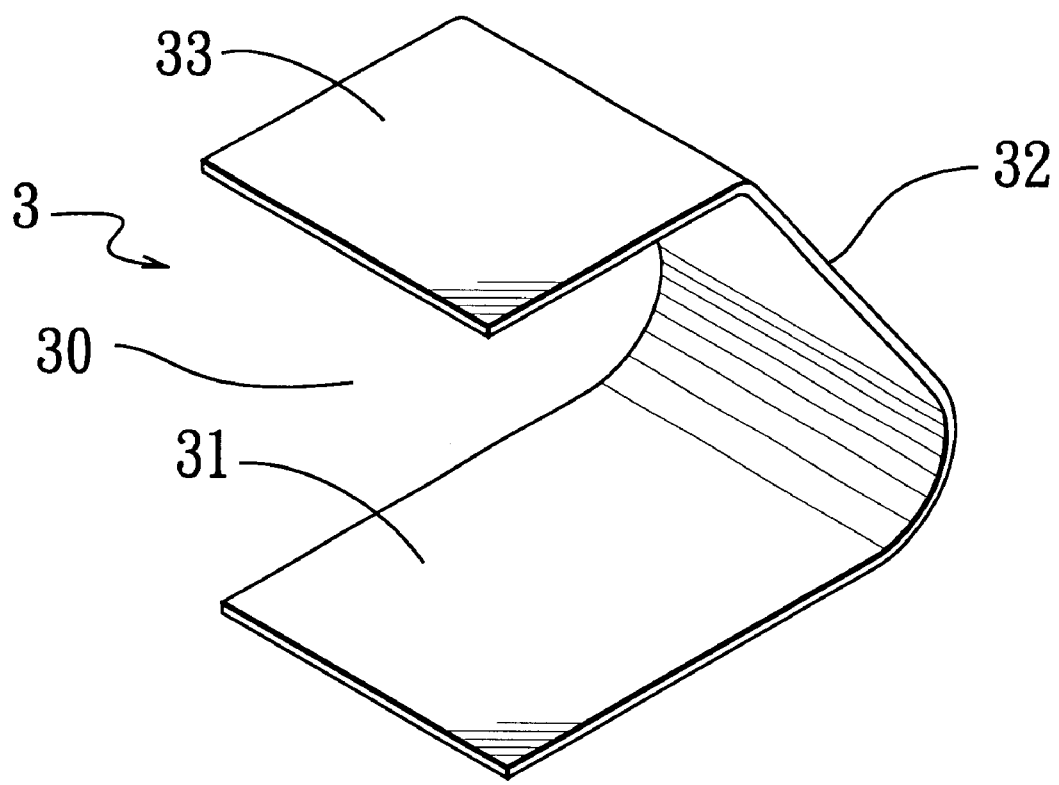
FIG. 2 is an enlarged perspective view of the conventional bent metal plate of FIG. 1.

Before the present invention is described in greater detail with reference to the following preferred embodiments, it should be noted that same reference numerals have been used to denote similar elements throughout the specification.

Figure 3:
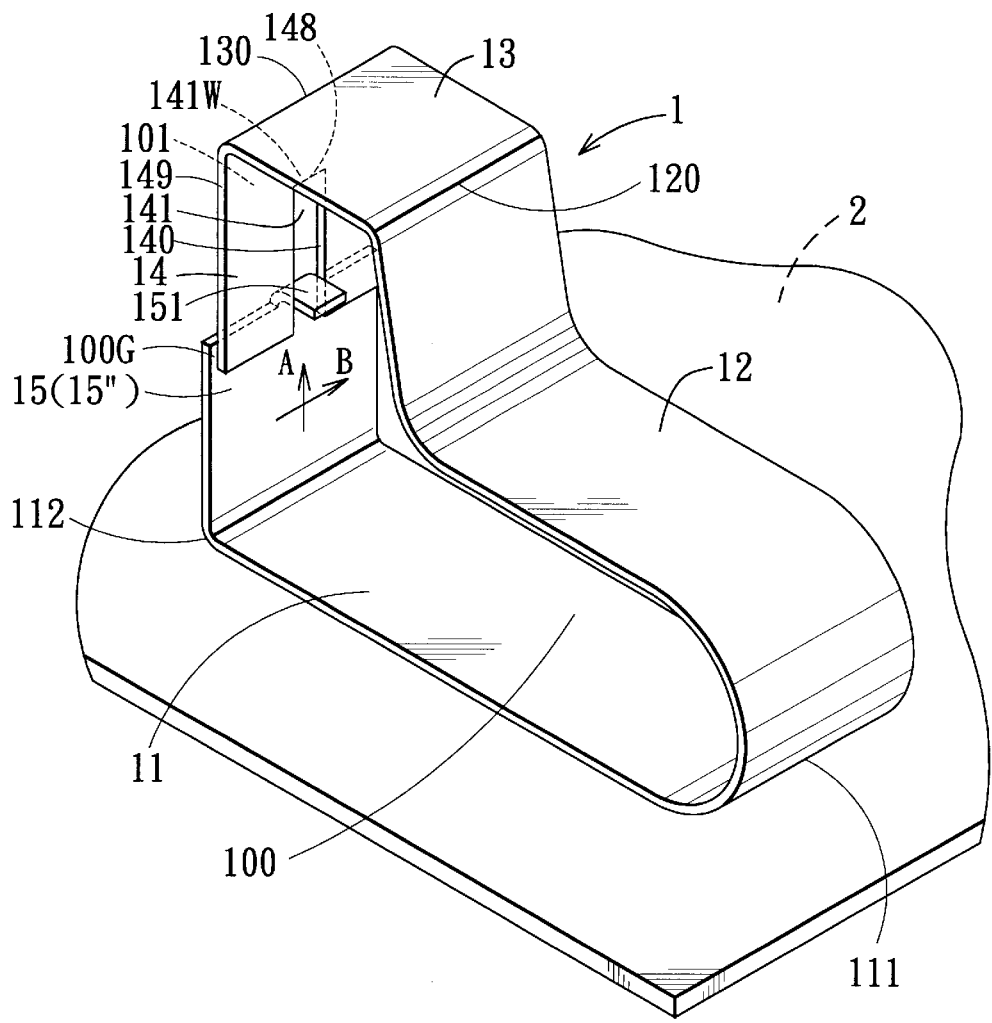
FIG. 3 is a perspective view of the first preferred embodiment of a bent metal plate according to the present invention when mounted on a printed circuit board.
Figure 4:
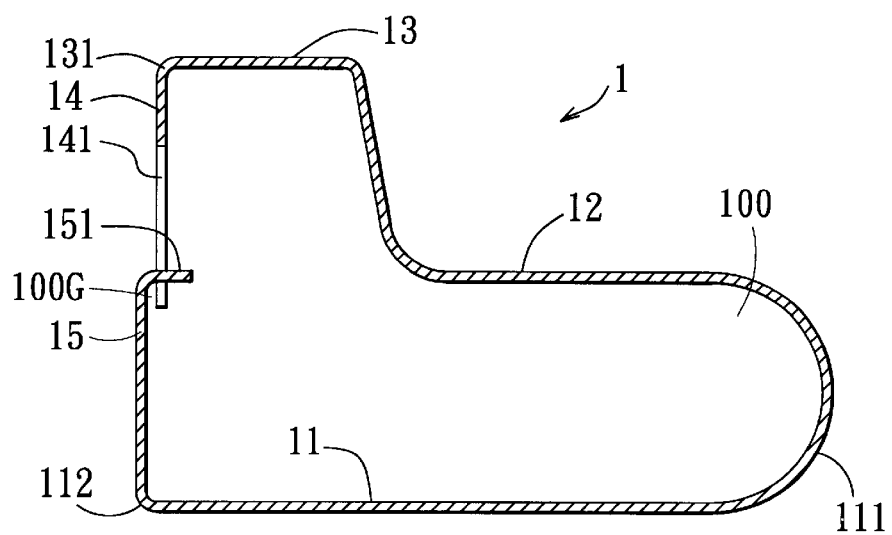
FIG. 4 is a sectional side view of the first preferred embodiment shown in FIG. 3.

Referring to FIGS. 3 and 4, the first preferred embodiment of a bent metal plate 1 according to the present invention is adapted to be mounted on a printed circuit board 2 in a conventional manner.

As illustrated, the bent metal plate 1 includes a mounting segment 11, a spring arm segment 12, an abutting segment 13, a first shielding segment 14, and a second shielding segment 15. The mounting segment 11 abuts against the printed circuit board 2, extends in a longitudinal direction, and has opposite first and second ends 111, 112. The spring arm segment 12 is bent from the first end 111 of the mounting segment 11, and has a distal end 120 disposed above the mounting segment 11. The abutting segment 13 is bent from the distal end 120 of the spring arm segment 12, and is vertically spaced apart from the mounting segment 11. The abutting segment 13 of the bent metal plate 1 according to the present invention is adapted to abut against the conductive element (see FIG. 1), such as a heat sink, and is adapted to prevent electromagnetic interference to an electronic component (not shown) mounted on the printed circuit board 2 and disposed below the conductive element. Since the features of the present invention does not reside in the construction of the conductive element and the printed circuit board 2, a detailed description thereof is omitted herein for the sake of brevity.

The abutting segment 13 has a distal end 130 generally aligned with the second end 112 of the mounting segment 11, and cooperates with the mounting segment 11 and the spring arm segment 12 to define a buffer space 100 thereamong with an opening 101 defined by the distal end 130 of the abutting segment 13 and the second end 112 of the mounting segment 11. The abutting segment 13 is springily depressible together with the spring arm segment 12 toward the mounting segment 11.

The first shielding segment 14 is bent from the distal end 130 of the abutting segment 13 toward the second end 112 of the mounting segment 11 to block an upper portion of the opening 101. The first shielding segment 14 is formed with a retaining channel 141.

The second shielding segment 15 includes at least one shielding piece 15" that is bent from the second end 112 of the mounting segment 11 toward the distal end 130 of the abutting segment 13 to block a lower portion of the opening 101, that cooperates with the first shielding segment 14 to define a gap 100G therebetween, and that has a blocking portion 151 extending through the gap 100G and the retaining channel 141 and into the buffer space 100 so as to deny access to the buffer space 100 through the gap 100G. By means of the blocking portion 151 of the second shielding segment 15, and the retaining channel 141 in the first shielding segment 14, the drawbacks of the aforesaid prior art can be eliminated. In this embodiment, the retaining channel 141 is in the form of a downwardly opening notch which is disposed between two opposite sides 149 of the first shielding segment 14. The downward opening notch is confined by an inverted U-shaped wall 141W that includes parallel left and right wall portions 140 and an upper wall portion 148 interposed between and interconnecting the left and right wall portions 140. The blocking portion 151 extends through the notch in the first shielding segment 14 in such a manner that the first shielding segment 14, together with the abutting segment 13 and the spring arm segment 12 is limited by the blocking portion 151 to move sidewisely (indicated by arrow (B) in FIG. 3) upon depression of the abutting segment 13, thereby preventing deformation of the bent metal plate 1 of the present invention during storage, assembly, or transport. In addition, the blocking portion 151 can abut against the upper wall portion 148 of the notch in the first shielding segment 14 so as to prevent further downward depression of the abutting segment 13 toward the mounting segment 11 (indicated by arrow (A) in FIG. 3), which in turn prevents permanent deformation of the spring arm segment 12. Moreover, since the gap 100G of the bent metal plate 1 of the present invention is shielded by the block portion 151, entanglement of the bent metal plate 1 with a string (not shown) hanging from the circuit board 2 as encountered during assembly of the electronic component on the printed circuit board in the aforesaid prior art can be avoided.

Figure 5:
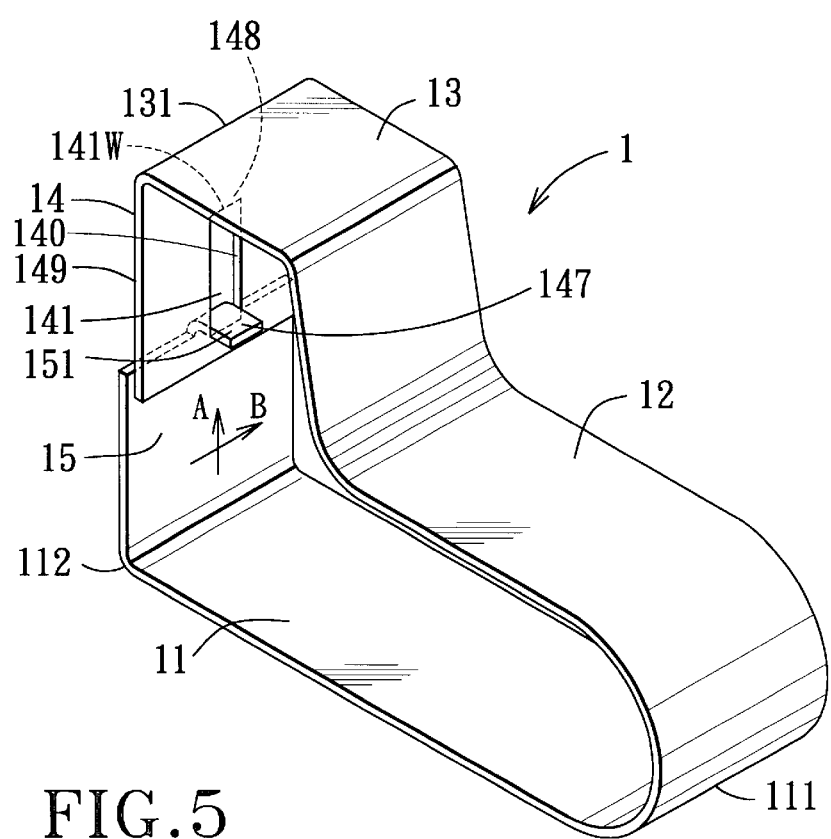
FIG. 5 is a perspective view of the second preferred embodiment of a bent metal plate according to the present invention.
Figure 6:
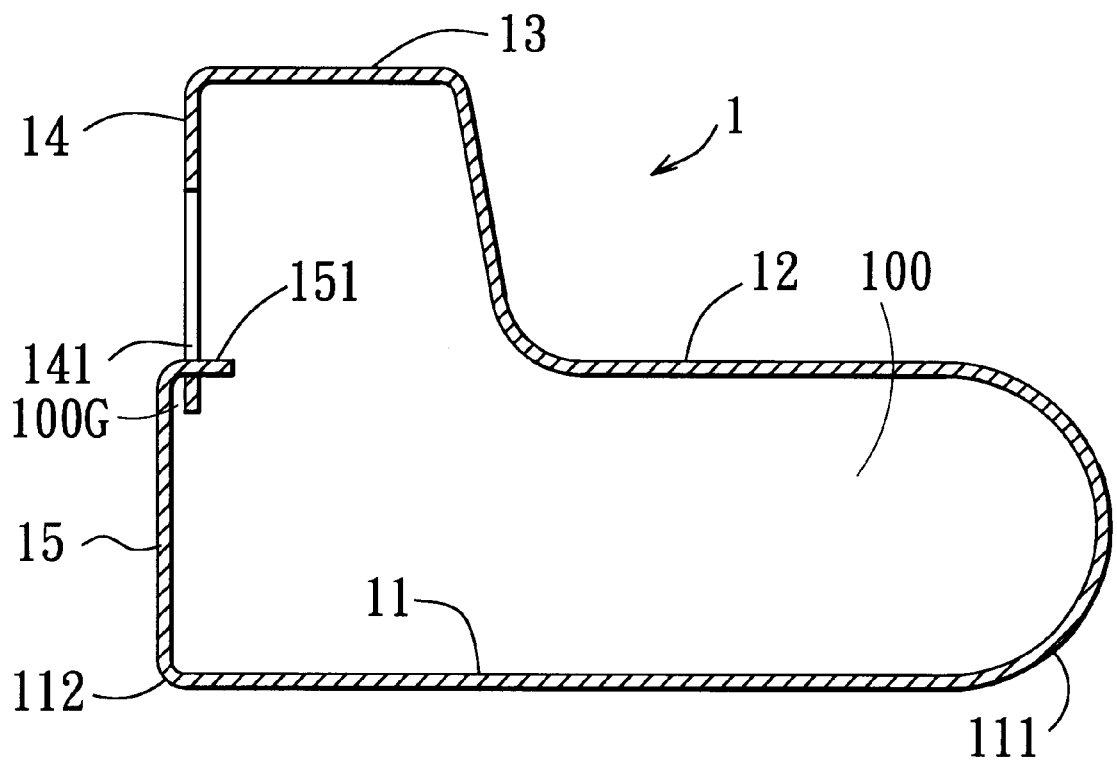
FIG. 6 a sectional side view of the second preferred embodiment.

Referring to FIGS. 5 and 6, the second preferred embodiment of the bent metal plate 1 according to the present invention is shown to have a construction similar to that of the previous embodiment. The main difference resides in that the retaining channel 141 is in the form of a rectangular opening formed between two opposite sides 149 of the first shielding segment 14. The rectangular opening is confined by a rectangular wall 141W that includes an upper wall portion 148, a lower wall portion 147, and parallel left and right wall portions 140 interconnecting the upper and lower wall portions 148, 147. The blocking portion 151 extends through the rectangular opening in such a manner that the first shielding segment 14 together with the abutting segment 13 and the spring arm segment 12 is limited by the blocking portion 151 to move sidewisely upon depression of the abutting segment 13. The blocking portion 151 can abut against the upper wall portion 148 of the rectangular opening in the first shielding segment 14 to stop further depression of the abutting segment 13 toward the mounting segment 11 so as to prevent permanent deformation of the spring arm segment 12. In addition, the blocking portion 151 can abut against the lower wall 147 of the rectangular opening in the first shielding segment 14 so as to prevent further movement of the abutting segment 13 away from the mounting segment 11, thereby preventing deformation of the bent metal plate 1 of the present invention.

Figure 7:
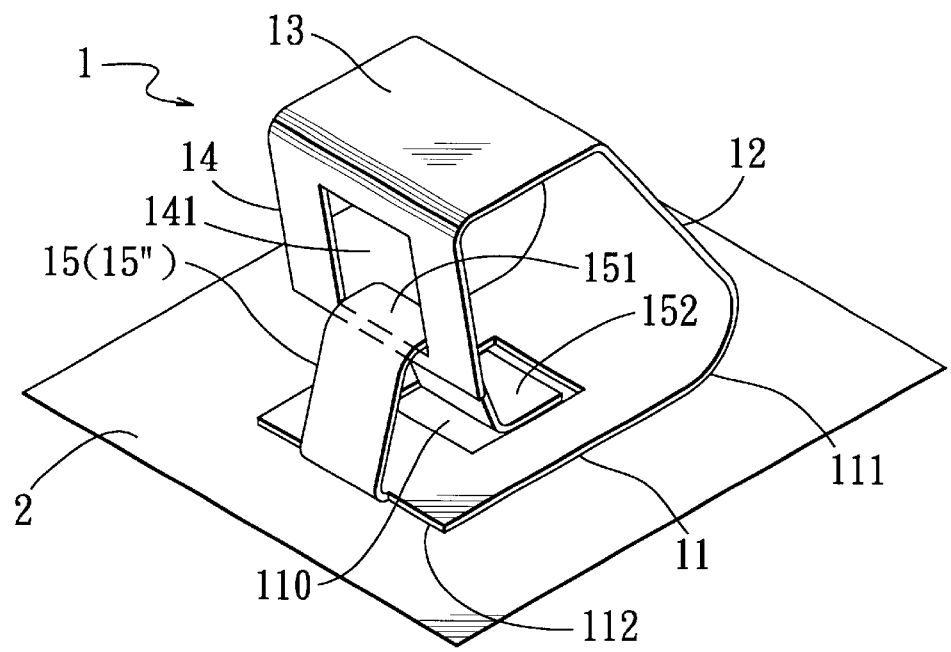
FIG. 7 is a perspective view of the third preferred embodiment of a bent metal plate according to the present invention when mounted on a printed circuit board.
Figure 8:
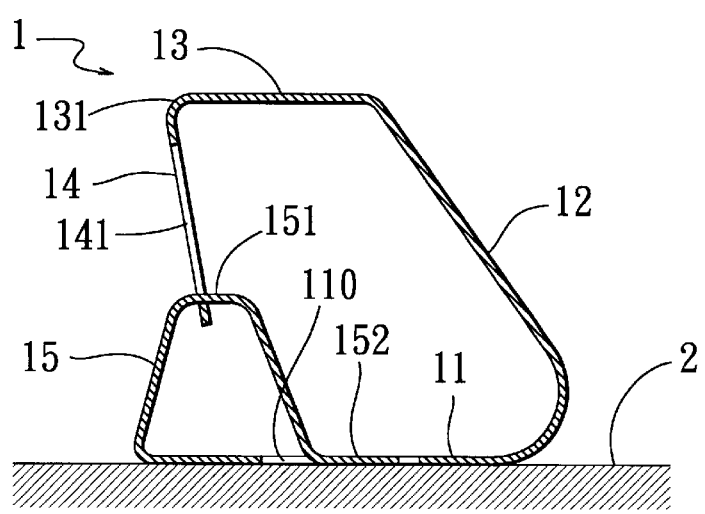
FIG. 8 is a sectional side view of the third preferred embodiment.

Referring to FIGS. 7 and 8, the third preferred embodiment of the bent metal plate 1 according to the present invention is shown to have a construction similar to that of the previous embodiments. The main differences reside in that the mounting segment 11 is further formed with a positioning hole 110 between the first and second ends 111, 112 to expose a portion of the printed circuit board 2, and that the second shielding segment 15 further includes a generally L-shaped reinforced portion 152 which extends downwardly from the blocking portion 151 into the positioning hole 110 in the mounting segment 11 so as to connect with the portion of the printed circuit board 2, thereby enhancing the rigidity of the second shielding segment 15.

Figure 9:
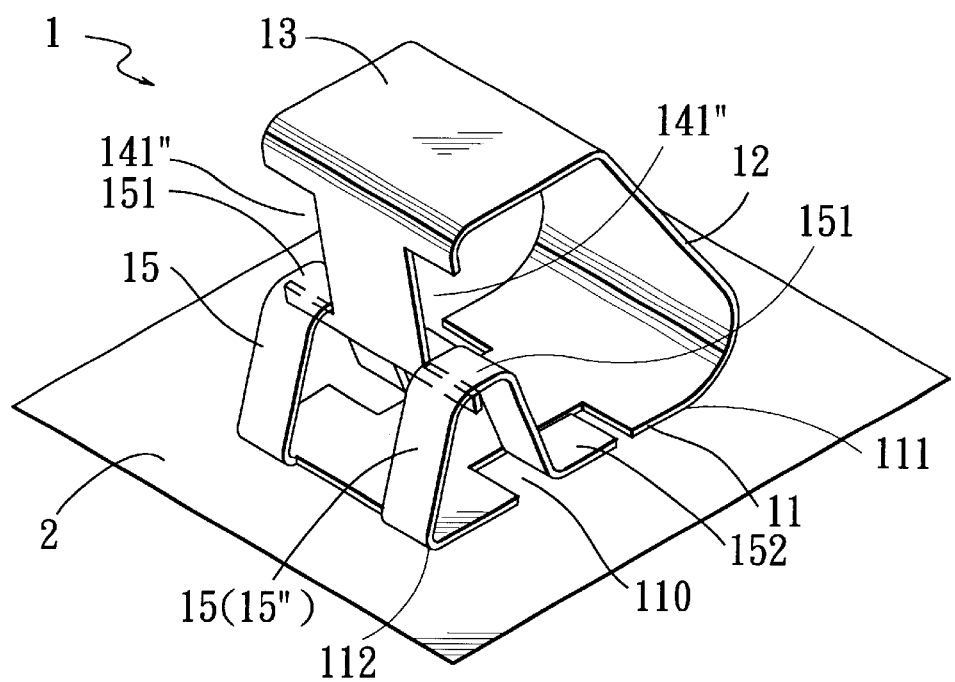
FIG. 9 is a perspective view of the fourth preferred embodiment of a bent metal plate according to the present invention.

Referring to FIG. 9, the fourth preferred embodiment of the bent metal plate 1 according to the present invention is shown to have a construction similar to that of the third preferred embodiment. The main differences reside in that the mounting segment 11 is formed with two opposite positioning notches 110 between the first and second ends 111, 112 of the mounting segment 11 so as to expose two opposite side portions of the printed circuit board 2. Two opposite sides of the first shielding segment 14 are formed with two retaining notches 141", each of which defines the retaining channel 141 (see FIG. 3). The second shielding segment 15 preferably includes two shielding pieces 15". The blocking portions 151 of the shielding pieces 15"

respectively extend through the retaining notches 141" and into the buffer space 100. The second shielding segment 15 further includes two L-shaped reinforced portions 152 extending downwardly and respectively from the blocking portions 151 into the positioning notches 110 in the mounting segment 11 so as to securely connect with the side portions of the printed circuit board 2, respectively, thereby enhancing the rigidity of the second shielding segments 15.

Figure 10:
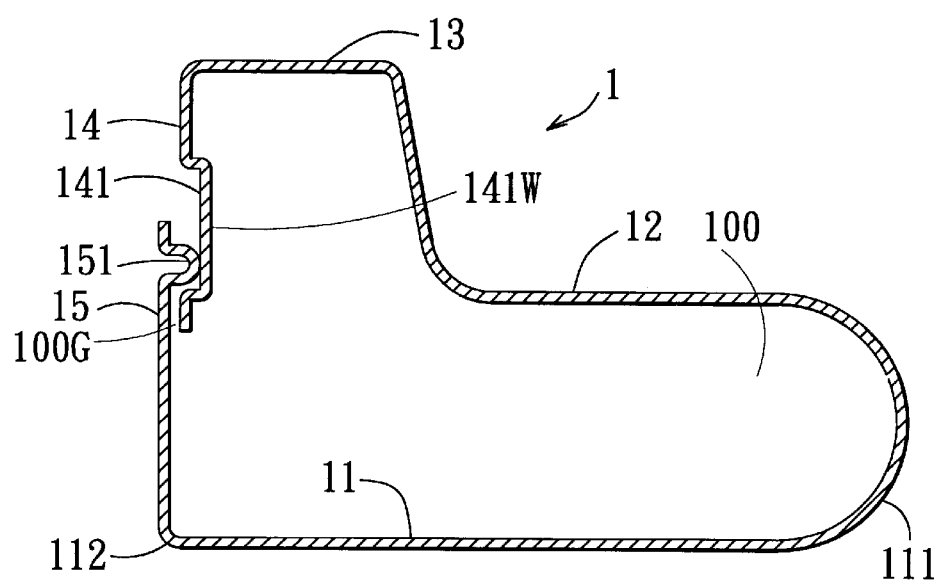
FIG. 10 is a sectional side view of the fifth preferred embodiment of a bent metal plate according to the present invention.

Referring to FIG. 10, the fifth preferred embodiment of the metal plate 1 according to the present invention is shown to have a construction similar to that of the first preferred embodiment. The only difference resides in that the first shielding segment 14 is formed with a retaining recess 141 confined by a recess-defining wall 141W. The second shielding segment 15 is formed with a retention tongue 151 extending through the gap 100G and into the retaining recess 141 to contact the recess-defining wall 141W so as to deny access to the buffer space 100 through the gap 100G, and so as to prevent deformation of the bent metal plate 1.

While the present invention has been described in connection with what is considered the most practical and preferred embodiments, it is understood that the present invention is not limited to the disclosed embodiments but is intended to cover various arrangements included within the spirit and scope of the broadest interpretation so as to encompass all such modifications and equivalent arrangements.

I claim:

1. A bent metal plate for use in an electronic device, said bent metal plate comprising:

a mounting segment adapted to be mounted on the electronic device, extending in a longitudinal direction, and having opposite first and second ends;

a spring arm segment bent from said first end of said mounting segment, and having a distal end disposed above said mounting segment;

an abutting segment bent from said distal end of said spring arm segment, vertically spaced apart from said mounting segment, having a distal end generally aligned with said second end of said mounting segment, and cooperating with said mounting segment and said spring arm segment to define a buffer space thereamong with, an opening defined by said distal end of said abutting segment and said second end of said mounting segment, said abutting segment being springily depressible together with said spring arm segment toward said mounting segment;

a first shielding segment bent from said distal end of said abutting segment toward said second end of said mounting segment to block an upper portion of said opening, and formed with at least one retaining channel; and a second shielding segment including at least one shielding piece that is bent from said second end of said mounting segment toward said distal end of said abutting segment to block a lower portion of said opening, that cooperates with said first shielding segment to define a gap therebetween, and that has a blocking portion extending through said gap and said retaining channel and into said buffer space so as to deny access to said buffer space through said gap.

2. The bent metal plate as defined in claim 1, wherein said first shielding segment has two opposite sides, said retaining channel being in the form of a downwardly opening notch which is disposed between said opposite sides of said first shielding segment and which is confined by an inverted U-shaped wall including parallel left and right wall portions and an upper wall portion interposed between and interconnecting said left and right wall portions, said blocking portion extending through said notch in such a manner that said first shielding segment together with said abutting segment and said spring arm segment is limited by said blocking portion to move sidewisely upon depression of said abutting segment, said upper wall portion abutting against said blocking portion to stop further depression of said abutting segment toward said mounting segment so as to prevent permanent deformation of said spring arm segment.

3. The bent metal plate as defined in claim 1, wherein said first shielding segment has two opposite sides, said retaining channel being in the form of a rectangular opening which is disposed between said opposite sides of said first shielding segment and which is confined by a rectangular wall including an upper wall portion, a lower wall portion, and parallel left and right wall portions interconnecting said upper and lower wall portions, said blocking portion extending through said rectangular opening in such a manner that said first shielding segment together with said abutting segment and said spring arm segment is limited by said blocking portion to move sidewisely upon depression of said abutting segment, said upper wall portion abutting against said blocking portion to stop further depression of said abutting segment toward said mounting segment so as to prevent permanent deformation of said spring arm segment, said lower wall portion abutting against said blocking portion so as to prevent further movement of said abutting segment away from said mounting segment.

4. The bent metal plate as defined in claim 3, wherein said mounting segment is further formed with a positioning hole that is disposed between said first and second ends and that is adapted to expose a portion of the electronic device, said second shielding segment further including a generally L-shaped reinforced portion extending downwardly from said blocking portion into said positioning hole so as to be adapted to be securely connected to the portion of the electronic device.

5. The bent metal plate as defined in claim 1, wherein said mounting segment has two opposite sides, each of which is formed with a positioning notch to expose two opposite side portions of the electronic device, said first shielding segment having two opposite sides formed with two retaining notches, each of which defines said retaining channel, said second shielding segment including two of said shielding pieces, said blocking portions of said shielding pieces extending respectively through said retaining notches into said buffer space, said second shielding segment further including two generally L-shaped reinforced portions extending downwardly and respectively from said blocking portions into said positioning notches so as to be adapted to be securely connected to the side portions of the electronic device.

6. A bent metal plate for use in an electronic device, said bent metal plate comprising:

a mounting segment adapted to be mounted on the electronic device, extending in a longitudinal direction, and having opposite first and second ends;

a spring arm segment bent from said first end of said mounting segment, and having a distal end disposed above said mounting segment;

an abutting segment bent from said distal end of said spring arm segment, vertically spaced apart from said mounting segment, having a distal end generally aligned with said second end of said mounting segment, and cooperating with said mounting segment and said spring arm segment to define a buffer space thereamong, with an opening defined by said distal end of said abutting segment and said second end of said mounting segment, said abutting segment being springily depressible together with said spring arm segment toward said mounting segment;

a first shielding segment bent from said distal end of said abutting segment toward said second end of said mounting segment to block an upper portion of said opening, and formed with a retaining recess confined by a recess-defining wall; and a second shielding segment including at least one shielding piece that is bent from said second end of said mounting segment toward said distal end of said abutting segment to block a lower portion of said opening, that cooperates with said first shielding segment to define a gap therebetween, and that has a retention tongue extending through said gap and into said retaining recess to contact said recess-defining wall so as to deny access to said buffer space through said gap.

* * * * *